US012622234B2

(12) United States Patent
Tsai et al.

(10) Patent No.:  US 12,622,234 B2
(45) Date of Patent:       May 5, 2026

(54) SELECTIVE IN-SITU CARBON-BASED MASK PROTECTION

(71) Applicant: Tokyo Electron Limited, Tokyo (JP)

(72) Inventors: Yu-Hao Tsai, Albany, NY (US); Du Zhang, Albany, NY (US); Mingmei Wang, Albany, NY (US); Maju Tomura, Miyagi (JP); Ryo Matsubara, Albany, NY (US); Yoshihide Kihara, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 256 days.

(21) Appl. No.: 18/616,493

(22) Filed: Mar. 26, 2024

(65) Prior Publication Data

US 2025/0308895 A1      Oct. 2, 2025

(51) Int. Cl.
| | |
|---|---|
| *H10P 76/40* | (2026.01) |
| *H01J 37/32* | (2006.01) |
| *H10P 50/00* | (2026.01) |
| *H10P 50/28* | (2026.01) |
| *H10P 76/20* | (2026.01) |

(52) U.S. Cl.
CPC .... *H10P 76/4085* (2026.01); *H01J 37/32449* (2013.01); *H10P 50/283* (2026.01); *H10P 50/73* (2026.01); *H10P 76/204* (2026.01); *H10P 76/405* (2026.01); *H01J 2237/3341* (2013.01); *H01J 2237/3346* (2013.01)

(58) Field of Classification Search
None
See application file for complete search history.

(56) References Cited

U.S. PATENT DOCUMENTS

| | | |
|---|---|---|
| 9,673,058 B1 | 6/2017 | Briggs et al. |
| 2018/0350618 A1 | 12/2018 | Hudson et al. |
| 2019/0362984 A1 | 11/2019 | Katsunuma |
| 2020/0075319 A1 | 3/2020 | Chang et al. |
| 2021/0335624 A1 | 10/2021 | Dole et al. |
| 2023/0245898 A1 | 8/2023 | Niizeki et al. |
| 2025/0218774 A1* | 7/2025 | Yang ..................... H10P 50/285 |

FOREIGN PATENT DOCUMENTS

| | | |
|---|---|---|
| KR | 101263666 B1 | 5/2013 |

OTHER PUBLICATIONS

International Searching Authority, "Notification of Transmittal of the International Search Report and the Written Opinion of the International Searching Authority, or the Declaration," PCT/US2025/013538, mailed May 19, 2025, 9 pages.

* cited by examiner

*Primary Examiner* — Roberts P Culbert
(74) *Attorney, Agent, or Firm* — Slater Matsil, LLP

(57)         ABSTRACT
A method of etching an underlying layer includes performing a pretreatment step, a reaction step, and an etch step. The pretreatment step includes exposing surfaces of a patterned carbon-containing layer to oxygen to form C—O bonds at the surfaces with or without using plasma. The reaction step includes exposing the C—O bonds to an oxygen-reactive precursor to selectively form a mask protection layer on the surfaces of the patterned carbon-containing layer. The etch step is performed after the pretreatment step, and includes flowing an etchant gas and exciting plasma from the etchant gas to etch the underlying layer using the patterned carbon-containing layer as an etch mask. Any of the pretreatment step, the reaction step, and the etch step may be performed consecutively, concurrently, or repeated as a cycle.

20 Claims, 8 Drawing Sheets

300

320
322
321

322

310

312

(319)

332
334
320

326

310

312

(301) + (302)

309

338

320
336

326

310

314

312

(303)

800

900

SELECTIVE IN-SITU CARBON-BASED MASK PROTECTION

TECHNICAL FIELD

The present invention relates generally to etching processes, and, in particular embodiments, to systems and methods for protecting a patterned carbon-containing layer used as an etch mask during an etching process.

BACKGROUND

Microelectronic device fabrication typically involves a series of manufacturing techniques that include formation, patterning, and removal of a number of layers of material on a substrate. Etch masks may be formed (e.g., deposited, grown, patterned) to protect regions of the substrate and allow for pattern transfer via etching. Wet or dry etching processes may be used, with plasma etching processes being an example of a dry etching process. Etching processes that etch dielectric materials are often used to create electrical (e.g., conductive) connections between and within layers.

Etching processes are used in a variety of semiconductor processing areas such as in memory manufacture. One category of etching processes is high aspect ratio (HAR) etching, which includes processes such as high aspect ratio contact (HARC) etches for contact formation. Obtaining a high aspect ratio during etching is important for a variety of semiconductor processes such as during NAND formation (e.g., 3D-NAND), NOR gate formation, and others. One way that manufacturers are using HAR etching processes to increase the number of transistors and other semiconductor devices per unit area, is utilizing the vertical dimension (3D). For example, in a 3D NAND memory array, charge trapping flash transistors are stacked vertically one on top of another on the sidewalls in high aspect ratio openings. In DRAM memory arrays, to increase capacitance, high aspect ratio DRAM trench capacitor openings are etched deeper and deeper into the semiconductor substrate. Through silicon vias (TSV) for stacking integrated circuit chips are fabricated by etching high aspect ratio holes completely through substrates.

The overall yield of the fabrication process is affected by both the quality of the features formed during etching processes (the etch profile) and the uniformity of the process across the substrate. Mask loss (due to the mask material being etched away during the etching process) can degrade the etch profile and decrease uniformity, both of which lower the yield of acceptable devices during the fabrication. Mask loss may be especially pronounced when employing high bias power, such as during a HAR etch, which may be used for important fabrication steps like HARC etches. Further, selectivity between the mask and feature sidewalls may also be important, such as to avoid profile problems like bowing.

One conventional method of combatting mask loss is to use a different material as the bulk material of the mask, but this can be more complicated and/or more expensive. Another conventional method is to increase the mask thickness, but this can have negative impacts on the patterning capabilities of the mask itself as well as the attainable aspect ratio and critical dimension (CD) for the etched features. Carbon deposition during the etching process can also afford some mask protection, the carbon is deposited on all surfaces (i.e., non-selectively) including the material being etched and therefore can work against the etching process even as it may protect the mask to some extent.

Therefore, improved etching methods that can selectively form mask protection layers on etch masks to improving selectivity may be desirable.

SUMMARY

In accordance with an embodiment of the invention, a method of etching an underlying layer includes performing a pretreatment step, a reaction step, and an etch step. The pretreatment step includes exposing surfaces of a patterned carbon-containing layer to an oxygen-containing gas to form C—O bonds at the surfaces. The patterned carbon-containing layer has openings exposing the underlying layer. The reaction step includes exposing the C—O bonds to an oxygen-reactive precursor to selectively form a mask protection layer on the surfaces of the patterned carbon-containing layer. The etch step is performed after the pretreatment step, and includes flowing an etchant gas and exciting plasma from the etchant gas to etch the underlying layer using the patterned carbon-containing layer as an etch mask.

In accordance with another embodiment of the invention, a method of etching an underlying layer includes performing a pretreatment step, a reaction step, and an etch step. The pretreatment step includes exposing surfaces of a patterned carbon-containing layer to oxygen to form C—O bonds at the surfaces. The patterned carbon-containing layer has openings exposing the underlying layer. The etch step is performed after the pretreatment step and includes concurrently flowing a gas mixture that includes an oxygen-containing gas, an oxygen-reactive precursor, and an etchant gas, selectively forming a mask protection layer on the surfaces of the patterned carbon-containing layer using the oxygen-reactive precursor, and exciting plasma from the gas mixture to etch the underlying layer using the patterned carbon-containing layer as an etch mask.

In accordance with still another embodiment of the invention, a plasma etching system includes a chamber configured to contain plasma, a substrate support disposed in the chamber and configured to support a substrate, an oxygen source fluidically coupled to the chamber and configured to supply an oxygen-containing gas through one or more valves, a precursor source fluidically coupled to the chamber and configured to supply an oxygen-reactive precursor through the one or more valves, and an etchant source fluidically coupled to the chamber and configured to supply an etchant gas through the one or more valves. The substrate includes a patterned carbon-containing layer having openings exposing an underlying layer. The plasma etching system further includes a controller operationally coupled to the one or more valves. The controller includes a processor and a non-transitory computer-readable medium storing a program including instructions that, when executed by the processor, perform a method. The method includes cyclically performing the following steps in situ within the chamber: performing a pretreatment step, a reaction step, and an etch step. The pretreatment step includes exposing surfaces of the patterned carbon-containing layer to the oxygen-containing gas to form C—O bonds at the surfaces. The reaction step includes exposing the C—O bonds to the oxygen-reactive precursor to selectively form a mask protection layer on the surfaces of the patterned carbon-containing layer. The etch step is performed after the pretreatment step and includes flowing the etchant gas and exciting plasma from the etchant gas to etch the underlying layer using the patterned carbon-containing layer as an etch mask.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
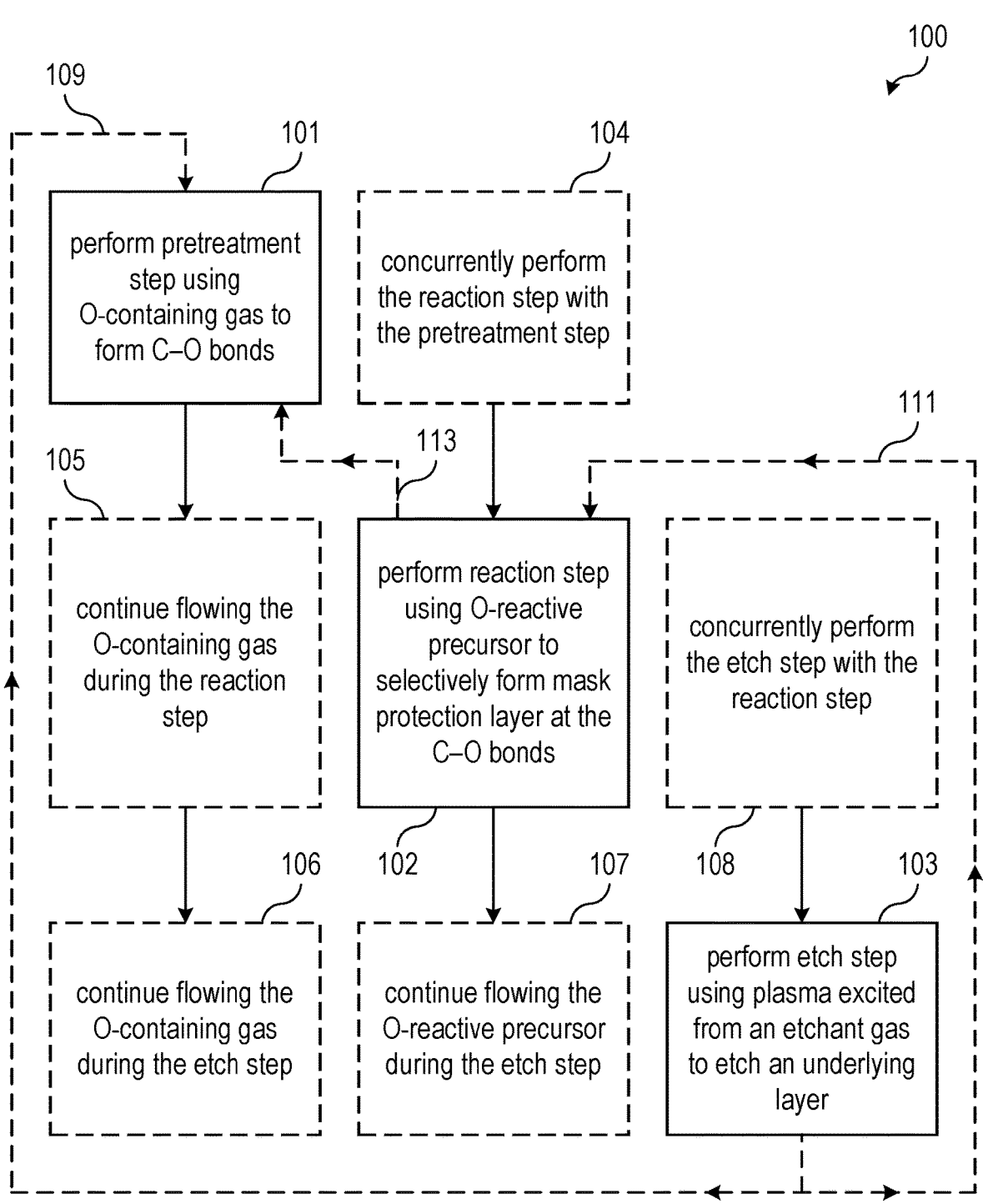
FIG. 1 illustrates an example method of etching an underlying layer that includes selectively forming a mask protection layer on a patterned carbon-containing layer following a pretreatment step using an oxygen-containing gas to create C—O bonds in accordance with embodiments of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope. Unless specified otherwise, the expressions "around", "approximately", and "substantially" signify within 10%, and preferably within 5% of the given value or, such as in the case of substantially zero, less than 10% and preferably less than % of a comparable quantity.

Mask loss can lead to degraded etch profile and reduced uniformity during etching processes of a target material. Although not strictly required, the mask material is often chosen so that it etches at a slower rate than the target material (i.e., the etch selectivity of the mask material relative to the target material, defined as ratio of etch rates between two materials using a given etching process, is greater than one and may be much greater than one). The ability of the mask material to function as an etch mask depends on the mask material continuing to cover the regions of the target material that are not intended to be etched.

As the etching process proceeds some mask material is etched away while the target material is etched. The effect of higher mask selectivity is to reduce the amount of mask material that is etched for a given amount of etched target material. However, simply choosing mask materials with higher selectivity may not be an option due to the myriad of other considerations that are accounted for when choosing a mask material. Without the ability to improve mask selectivity, the mask thickness may also be increased, but this also comes with drawbacks, including potentially reducing achievable CD and or aspect ratio of the features.

One alternative is to deposit mask protection layers before the etching process and/or in situ during the etching process to slow the etch rate of the mask material. Carbon-based materials are a category of mask protection material that can be deposited during the etching process (e.g., as a side-effect of using carbon-containing etchants, such as fluorocarbons or hydrofluorocarbons, as in dielectric etches, for example). Yet, deposition of carbon-based materials is not a selective process resulting in carbon-based material also being deposited on the target material (such as sidewalls and the etch front). Moreover, carbon-based materials do not provide a sufficient selectivity benefit in fluorine- and/or hydrogen-rich plasma etching environments.

In accordance with embodiments herein described, the invention proposes an etching processes and methods that leverage thermodynamically favorable reactions with oxygen (O) at surfaces of a patterned carbon-containing (C-containing) layer to selectively form mask protection layers in situ during the etching process. In various embodiments, a method of etching an underlying includes a pretreatment step to provide oxygen (e.g., $O_2$, CO, etc.) at surfaces of the patterned C-containing layer, which may be any type of material that includes carbon, such as an amorphous carbon layer (ACL), an organic photoresist, spin-on carbon (SoC), and others.

A reaction step is then performed that includes exposing the treated surfaces (now having oxygen, whether physisorbed, chemisorbed, or a combination thereof) to an oxygen-reactive precursor (e.g., including an oxygen-reactive species, such as tungsten (W), and may be a halide, such as a metal halide, like tungsten fluoride ($WF_6$)) that interacts (e.g., reacts) with the oxygen to form a mask protection layer. The underlying layer is then etched with a plasma formed from an etchant gas (e.g., hydrogen-containing, fluorine-containing, and/or chlorine-containing, as examples) during an etch step using the patterned C-containing layer (with the mask protection layer) as an etch mask. The pretreatment step, reaction step, and the etch step may be entirely separate steps or overlap (partially or entirely) and in various combinations as will be discussed in more detail in the following.

The proposed etching processes and methods differ from other conventional methods. For example, tungsten fluoride has been included in an etch gas. However, a higher order carbon-based gas (i.e., an unsaturated compound, having at least one double bonded carbon (C=C) or triple bonded carbon (C≡C)) is also included as a passivation component along with the tungsten fluoride so that a composite tungsten-carbon material is deposited on sidewalls (including sidewalls of the features). The lacks flexibility as well, requiring that both tungsten fluoride and the passivation component be included in the etch gas, and that a plasma be formed from the etch gas.

Another conventional method is to perform atomic layer deposition (ALD) of a protective film in between etch steps. The ALD process uses two fully separate and self-limiting deposition steps that require purging between each step. One of the steps includes tungsten fluoride, but must have no plasma to allow the tungsten fluoride to adsorb. The other step $O_2$ and requires an oxygen plasma, which can decrease selectivity by damaging carbon-containing structures. Further, as with the above example, the protective film of conventional ALD processes is designed to be conformal to the feature sidewalls as well as the etch mask surfaces. Therefore, these conventional approaches are not selective to the etch mask, which is different than the selective formation of a mask protection layer in the presently described etching processes and methods.

The etching processes and methods described herein may advantageously utilize new chemistry to achieve selectivity to carbon-based materials when forming mask protection layers compared to conventional mask protection techniques. For example, the mask protection layer of the proposed etching processes may selectively form on surfaces having oxygen and carbon (e.g., as C—O bonds or even physisorbed oxygen) whereas conventional process flows result in uniformly deposited mask protection material (i.e., including feature sidewalls). The selectivity to the etch mask may advantageously provide improved mask-to-sidewall selectivity, which is not provided by unselective deposition techniques.

Another benefit may be that a wider array of possible mask protection materials may be made available using the etching processes described herein. For example, various compounds may react with surfaces containing oxygen and carbon over surfaces, such as compounds that readily participate in hydrolysis reactions, for example. A further potential advantage of selectively forming a mask protection layer is higher etch resistance (e.g., in hydrogen-, chlorine- and/or fluorine-rich environments, such as when the mask protection layer is primarily W, as one example). Improved etch selectivity may be especially beneficial when etching dielectric materials including stacks of dielectric materials like an ONON stack (alternative oxide layers and nitride layers) or an OPOP stack (alternating oxide layers and polysilicon layers).

Figure 2:
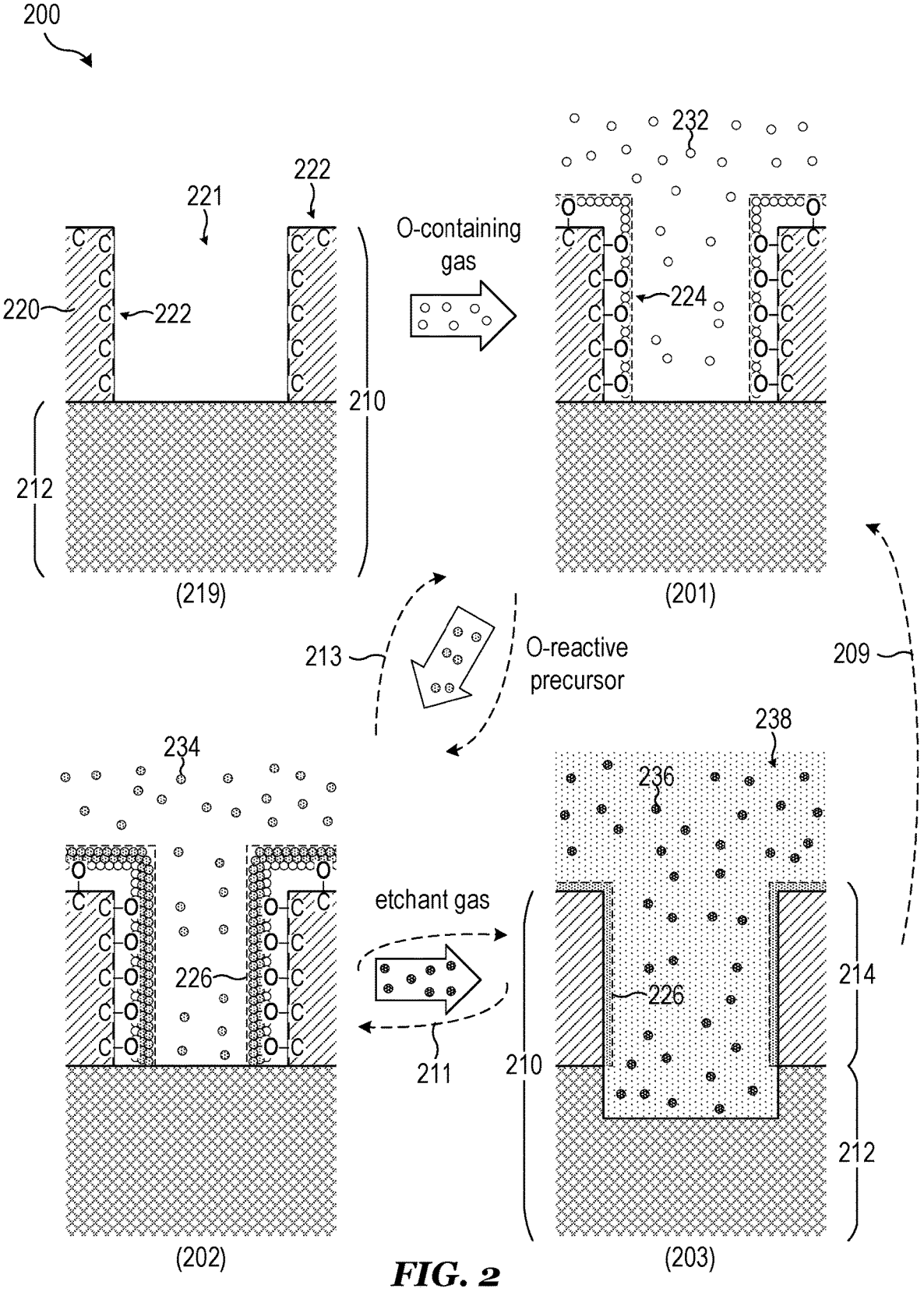
FIG. 2 illustrates an example etching process schematically showing an initial state of a substrate including a patterned carbon-containing layer having openings exposing an underlying layer, and a pretreatment step, a reaction step, and an etch step of the etching process in accordance with embodiments of the invention.

Embodiments provided below describe various methods and systems for protecting a patterned C-containing layer used as an etch mask during an etching process, and in particular embodiments, to systems and methods for protecting a patterned C-containing layer that include a pretreatment step to form C—O bonds at surfaces of the patterned C-containing layer to selectively form a mask protection layer. The following description describes the embodiments. FIG. 1 is used to describe an example method of etching an underlying layer that includes selective formation of a mask protection layer. FIG. 2 is used to describe an example etching process implementing the pretreatment step to selectively form a mask protection layer. Three more example etching processes are described using FIGS. 3-5. An example plasma etching system that may be used to perform the etching processes and methods is described using FIG. 6. A qualitative graph of reaction energy for forming a mask protection layer on various categories of materials that may be included in the etching processes and methods is described using FIG. 7. Two specific example methods are described using FIGS. 8 and 9.

FIG. 1 illustrates an example method of etching an underlying layer that includes selectively forming a mask protection layer on a patterned carbon-containing layer following a pretreatment step using an oxygen-containing (O-containing) gas to create C—O bonds in accordance with embodiments of the invention.

Referring to FIG. 1, a method 100 of etching an underlying layer includes a pretreatment step 101 where surfaces of a patterned C-containing layer (e.g., an ACL mask, SoC, mask, photoresist mask, etc.) are exposed to oxygen. For example, the surfaces may be exposed to an O-containing gas and the available oxygen may interact with carbon at the surfaces and form bonds. In one embodiment, the O-containing gas is $O_2$, but many other oxygen sources are possible, such as CO, COS, $O_3$, and others. In various embodiments, the O-containing gas includes carbon while in other embodiments, the O-containing gas is pure oxygen (e.g., $O_2$, $O_3$). Both may have advantages in certain applications. For example, including carbon may positively influence the process of acquiring oxygen at the surfaces (e.g., because the patterned layer also includes carbon). Using pure oxygen may have the benefit of being a very clean process step (e.g., no additional species that may adversely affect other structures or processes).

In one embodiment, the C—O bonds formed at the surfaces of the patterned C-containing layer are chemical bonds. However, physisorbed oxygen (e.g., oxygen adhering to carbon through van der Waals forces) may also be present, or account for the majority of the C—O bonds in extreme cases. While larger amounts of oxygen at the surfaces may be beneficial in some cases, there is no requirement that the surfaces of the patterned C-containing layer be completely covered with oxygen. Partial or even sparse coverage may still produce desired effects depending on specific details of a given etching process.

In a reaction step 102, the C—O bonds are exposed to an oxygen-reactive (O-reactive) precursor to selectively form a mask protection layer on the surfaces of the patterned C-containing layer. The presence of the oxygen at the surface alters the energy structure of the surface of the patterned C-containing layer, which may advantageously allow the selection of an O-reactive precursor that will react with the C—O bonds at a faster rate (i.e., selectively) relative to other potential reaction sites, such as materials of the underlying layer. In various embodiments, the O-reactive precursor is a halide gas, such as a metal halide gas. In other embodiments, the O-reactive precursor is an organometallic compound, such as a coordination complex. In some embodiments, the O-reactive precursor includes tungsten (W), such as in a W-containing gas. Some examples of possible O-reactive precursors include $WF_6$, $WCl_6$, $W(CO)_6$, $W(CH_3)_6$, and others.

At least initially, the O-reactive species (such as W, for example) reacts with oxygen and may form structures like C—O—W at the surfaces of the patterned layer. However, in some cases, which again includes W, the O-reactive species may then build on itself forming a pure or substantially pure bulk material of the O-reactive substance (e.g., C—O—W—W—W— . . . ) This may be particularly advantageous when the pure material is desirable for improving selectivity, as is the case with W in certain environments, such as hydrogen-, chlorine-, and/or fluorine-rich etch environments. Such environments may be found when etching dielectrics, including oxides, nitrides, ONON (a stack of alternating oxide and nitride), OPOP (a stack alternating oxide and polysilicon), and others.

The underlying layer is etched during an etch step 103 using plasma excited from an etchant gas. The etchant gas may be flowed into a chamber (e.g., an etching chamber) and source power may be coupled to the etchant gas to excite the plasma and etch the underlying layer. The patterned C-containing layer (along with the mask protection layer) is used as an etch mask during the etch step 103. The mask protection layer selectively formed on the surfaces of the patterned C-containing layer in the reaction step 102 decreases the amount of mask material that is lost during the etch step 103.

The etchant gas may be any suitable etchant gas selected to (i.e., configured to) etch the underlying layer using the patterned C-containing layer as the etch mask. In various embodiments, the etchant gas includes fluorine, and includes a fluorocarbon compound in some embodiments. For example, the etchant gas includes a hydrofluorocarbon compound in some embodiments. When carbon-containing compounds are included in the etchant gas, either saturated compounds or unsaturated compounds (e.g., higher order) may be included. However, in some embodiments (such as when carbon-based polymer deposition is not desirable during the etch step 103), polymer-forming carbon-based compounds like unsaturated compounds may be avoided. Specifically, in some embodiments, all C-containing compounds in the etchant gas are saturated compounds.

For example, the mask protection layer may have high etch resistance to the etchant gas causing it to have a slow etch rate during the etch step 103 relative to the underlying layer. For example, in embodiments where the mask protection layer includes W, the mask protection layer may increase etch resistance of the mask in various etching environments, such as hydrogen-, chlorine-, and fluorine-rich environments. Yet, even if the mask protection does not have higher etch resistance than the patterned C-containing layer or even the underlying layer, the selective nature of the formation of the mask protection layer may still provide the mask protection benefit by virtue of adding material to the mask with little or no mask protection material being deposited on the underlying layer.

While the pretreatment step 101, the reaction step 102, and the etch step 103 may be performed consecutively as separate steps, many of the steps may overlap and portions of the method 100 may be repeated as cycles in order to accomplish the goals of a given application. For example, an optional concurrent step 104 may be included where the reaction step 102 is performed concurrently with the pretreatment step 101. That is, the O-containing gas and the O-reactive precursor may be flowed at the same time. The etchant gas may also be provided during the reaction step 102 when an optional concurrent step 108 is included. Notably, concurrent performance of any of the steps does not require that the concurrent steps have the same start point, duration, or end point; the steps that are performed concurrently may overlap to any extent as desired by the specific details of a given application.

Additionally, the pretreatment step 101, the reaction step 102, and the etch step 103 may advantageously be performed without purging steps (e.g., in contrast to ALD processes, for example). For example, the reaction step 102 may be performed immediately after the pretreatment step 101 without purging the O-containing gas.

An optional continuation step 105 may be included where the pretreatment step 101 is continued during the reaction step 102 (i.e., the O-containing gas is provided first during the pretreatment step 101 and continues to be provided during the reaction step 102 when the O-reactive precursor is introduced). Similarly, an optional continuation step 106 may also be included where the O-containing gas is also provided during the etch step 103. The O-reactive gas may also be provided during the etch step 103 in an optional continuation step 107. It should be mentioned that while the optional continuation step 106 is labeled as a continuation step, it may be included without the optional continuation step 105 in some embodiments. Specifically, the O-containing gas may not be provided during the reaction step 102 and then provided again during the etch step 103.

Plasma is utilized during the etch step 103 to etch the underlying layer. However, plasma may or not be used during the pretreatment step 101 and the reaction step 102. In one embodiment, no plasma is excited during the pretreatment step 101. The parameters of a given process will vary depending on the details of a specific application. By way of example, for non-plasma steps, the pressure may take on a broad range of values, the temperature may be less than about 100° C., and the duration of the step may be as long as other considerations allow (e.g. throughput, secondary processes, etc.), or long enough to achieve desire results. Example parameter regimes for plasma steps may include the pressure being in the range of about 25 mT-500 mT, the temperature being less than about 100° C., the source power being less than about 500 W, and flowrate below about 500 sccm.

When plasma is exited during a step of the method 100, it is excited from the gas mixture that is being provided during that step. For example, in embodiments where the O-containing gas, the O-reactive precursor, and the etchant gas are all provided as part of a gas mixture flowed during the etch step 103, the plasma is excited from the gas mixture. As discussed above, it may be advantageous in some applications to avoid polymer deposition during the etch step 103. In some embodiments, all C-containing compounds in the gas mixture are saturated compounds.

In various embodiments, during the pretreatment step 101, the O-containing gas may be provided with low energy (even when plasma is included). For example, the temperature of the O-containing gas may be low (e.g., room temperature) and when plasma is included the source power may be kept low (e.g. below 500 W). This may advantageously prevent damage to structures such as the patterned C-containing layer during the pretreatment step 101. When plasma is excited during the pretreatment step 101, source power at a higher power (etch source power) may be used to excite plasma during the etch step 103 while source power at a lower power (pretreatment source power) may be used to excite plasma during the pretreatment step 101.

Similarly, the energy of the O-reactive precursor may also be below a desired threshold (e.g., also relatively low) during the reaction step 102. Since the O-reactive precursor is selected so that reactions with the C—O bonds are favorable relative to reactions with other bond types in the substrate, it may be advantageous to provide the O-reactive precursor at an energy below the threshold where other reactions become thermodynamically viable. In various embodiments, the energy of the O-reactive precursor is below about 1 eV during the reaction step 102 and is below about 0.25 eV in one embodiment.

Various steps of the method 100 may be repeated. For example, the entire method including the pretreatment step 101, the reaction step 102, and the etch step 103 may be repeated as part of a cycle 109. This may be desirable, when the etch step 103 results in bare surfaces of the patterned C-containing layer (e.g., surfaces that do not include surface oxygen), such as when the mask protection layer is fully etched away during the etch step 103. In some cases, some of the mask protection layer may still be present after the etch step 103. The reaction step 102 and the etch step 103 may then be repeated as part of a cycle 111 that replenishes the mask protection layer using the O-reactive precursor and continues to etch the underlying layer with the etchant gas. Further, in some applications, more oxygen may be provided to form the mask protection layer after the reaction step 102. In some embodiments, the pretreatment step 101 and the reaction step 102 may be repeated as part of a cycle 113.

FIG. 2 illustrates an example etching process schematically showing an initial state of a substrate including a patterned carbon-containing layer having openings exposing an underlying layer, and a pretreatment step, a reaction step, and an etch step of the etching process in accordance with embodiments of the invention. The etching process of FIG. 2 may implement some or all of the steps of any of the methods of etching an underlying layer described here, such as the method of FIG. 1, for example. Similarly labeled elements may be as previously described.

Referring to FIG. 2, an etching process 200 includes both a pretreatment step 201 and a reaction step 202 that selectively form a mask protection layer 226 on surfaces 222 of a patterned C-containing layer 220. An underlying layer 212 is etched with a plasma 238 using the patterned C-containing layer 220 (together with the mask protection layer 226) as an etch mask 214 during an etch step 203. It should be noted that here and in the following a convention has been adopted for brevity and clarity wherein elements adhering to the pattern [x01] where 'x' is the figure number may be related implementations of a pretreatment step in various embodiments. For example, the pretreatment step 201 may be similar to the pretreatment step 101 except as otherwise stated. An analogous convention has also been adopted for other elements as made clear by the use of similar terms in conjunction with the aforementioned numbering system.

At the top left of FIG. 2, an initial state 219 of a substrate 210 is schematically shown. The substrate 210 includes the underlying layer 212, which is exposed through openings 221 of the patterned C-containing layer 220. The surfaces 222 of the patterned C-containing layer 220 include both horizontal upper surfaces and vertical sidewall surfaces. Although not required, in this specific example, the underlying layer 212 has not been etched. In other embodiments, the initial state 219 may include recesses or other structured features of the underlying layer 212.

The underlying layer 212 may be included as part of the substrate 210 (e.g., as shown or supported by another layer, which may be a semiconductor layer, such as a device layer, of a wafer, for example). The substrate 210 may be any suitable substrate, such as an insulating, conducting, or semiconducting substrate with one or more layers disposed thereon. For example, the substrate 210 may be a semiconductor wafer, such as a silicon wafer, and include various layers, structures, and devices (e.g., forming integrated circuits). In one embodiment, the substrate 210 includes silicon. In another embodiment, the substrate 210 includes silicon germanium (SiGe). In still another embodiment, the substrate 210 includes gallium arsenide (GaAs). Of course, many other suitable materials, semiconductor or otherwise, may be included in the substrate 210 as may be apparent to those of skill in the art.

The underlying layer 212 may be any suitable material or combination of materials. In various embodiments, the underlying layer 212 includes an oxide material, and the underlying layer 212 includes silicon dioxide (SiO$_2$) in one embodiment. In some embodiments, the underlying layer 212 includes a nitride material, and includes silicon nitride (Si$_3$N$_4$) in one embodiment. Of course, other types of dielectric material may also be included in the underlying layer 212, such as an oxynitride material (e.g., silicon oxynitride (SiO$_x$N$_y$), and others).

The underlying layer 212 may include more than one type of material (including materials not necessarily acting as or classified as dielectric materials even with the underlying layer 212 itself may be considered a dielectric layer). In some specific applications, such as HARC etches, the underlying layer 212 may be a stack of several layers of dielectric material, such as an ONON stack, an OPOP stack, and the like. Of course, the simple pattern of ONON and OPOP is not required, the underlying layer 212 may be any stack of materials.

The openings 221 of the patterned C-containing layer 220 are configured to be used to etch a desired pattern into the underlying layer 212. The patterned C-containing layer 220 may be any suitable patterned layer that is configured to protect regions of the underlying layer 212 while allowing the underlying layer 212 to be etched through the openings 221 during an etching process. In various embodiments, the patterned C-containing layer 220 is a hardmask, such as an ACL. The patterned C-containing layer 220 may be electrically conductive, semiconducting, or insulating. Other possible carbon-based materials include diamond-like carbon, (SoC), and the like. The underlying layer 212 does not include carbon, which may be advantageous for achieving selectivity during the etching process 200.

During the pretreatment step 201, an O-containing gas 232 is provided at the substrate 210 (e.g., by flowing the O-containing gas 232 into an etch chamber) and oxygen is acquired (e.g., physisorbed and/or chemisorbed to form C—O bonds 224). At this stage of the etching process 200, the surfaces 222 may advantageously have a thermodynamically favorable configuration for selectively interacting with an O-reactive precursor 234, which is provided at the substrate 210 in the reaction step 202. While some acquisition of the O-reactive precursor 234 may occur on other materials, such as the underlying layer 212, the O-reactive precursor 234 is selected to (i.e., configured to) selectively form the mask protection layer 226 at the surfaces 222 relative to other surfaces of the substrate 210.

In some cases, such as to deposit a thicker mask protection layer, the pretreatment step 201 and the reaction step 202 may be repeated as part of a cycle 213. The pretreatment step 201 and the reaction step 202 may also be performed together in some embodiments. Each iteration of the process to selectively form the mask protection layer 226 begins with the pretreatment step 201 or the pretreatment step 201 is performed concurrently with the reaction step 202. That is, at the beginning of the etching process 200, the patterned C-containing layer 220 includes carbon at the surfaces 222 (e.g., in various configurations, such as bonded to other species like hydrogen, or with dangling bonds, or a combination thereof) and the C—O bonds 224 are formed during the pretreatment step 201 either before or while providing the O-reactive precursor 234 in the reaction step 202, but not after.

The mask protection layer 226 is configured to protect the patterned C-containing layer 220 during the etch step 203 (i.e. reduce the effective rate that the etch mask 214 is diminished relative to the patterned C-containing layer 220 with no mask protection layer 226). During the etch step 203 an etchant gas 236 is provided at the substrate 210. The etchant gas 236 is excited to form the plasma 238 (i.e., the etch step 203 is a plasma etching step), and the underlying layer 212 is etched. For example, the underlying layer 212 may be a dielectric material, such as an oxide or a nitride, or may include more than one material like ONON or OPOP.

The mask protection layer 226 may be consumed by the etchant gas 236 at a sufficiently fast rate relative to the etch rate of the underlying layer 212 that selectively forming more of the mask protection layer 226 may be advantageous. In some embodiments, the reaction step 202 and the etch step 203 are performed concurrently (which may replenish the mask protection layer 226 while the underlying layer 212 is actively being etched). In one embodiment, the reaction step 202 is performed separately (i.e., before the etch step 203, but not necessarily separately from the pretreatment step 201) and the O-reactive precursor 234 is also flowed during the etch step 203 along with the etchant gas 236 to replenish the mask protection layer 226.

In some cases, the selective formation of the mask protection layer 226 may advantageously continue without requiring additional oxygen (i.e., a bulk region of the species in the O-reactive precursor 234 that reacts with the oxygen and remains to form the mask protection layer 226, such as W as one example, may be formed even after the C—O reaction sites are covered). For example, the O-reactive precursor 234 may continue to selectively form additional layers of the mask protection layer 226 without the C—O bonds 224 exposed at the surface. In various embodiments, the reaction step 202 and the etch step 203 are repeated as part of a cycle 211 (i.e., without repeating the pretreatment step 201) to replenish the mask protection layer 226 and continue etching the underlying layer 212.

Of course, if including the pretreatment step 201 between some or all of iterations of the etch step 203 is desirable for a given application, the pretreatment step 201, the reaction step 202, and the etch step 203 may all be repeated as part of a cycle 209, as shown. Moreover, as long as C—O bonds 224 are formed on the patterned C-containing layer 220, the pretreatment step 201, the reaction step 202, and the etch step 203 may all be performed concurrently for some or all of the etching process 200.

Figure 3:
FIG. 3 illustrates an example etching process schematically showing an initial state of a substrate including a patterned carbon-containing layer having openings exposing an underlying layer, and an etch step performed after concurrently performing a pretreatment step and a reaction step in accordance with embodiments of the invention.

FIG. 3 illustrates an example etching process schematically showing an initial state of a substrate including a patterned carbon-containing layer having openings exposing an underlying layer, and an etch step performed after concurrently performing a pretreatment step and a reaction step in accordance with embodiments of the invention. The etching process of FIG. 3 may be a specific implementation of other etching processes described herein, such as the etching process of FIG. 2, for example. Similarly labeled elements may be as previously described.

Referring to FIG. 3, an etching process 300 includes both a pretreatment step 301 and a reaction step 302 that selectively form a mask protection layer 326 on surfaces 322 of a patterned C-containing layer 320. An underlying layer 312 is etched with a plasma 338 using the patterned C-containing layer 320 (together with the mask protection layer 326) as an etch mask 314 during an etch step 303. The etching process 300 is a specific example of and is similar to the etching process 200 except that the etching process 300 specifically illustrates that the pretreatment step 301 and the reaction step 302 are performed concurrently.

In an initial state 319 of a substrate 310, surfaces 322 of the patterned C-containing layer 320 are untreated (i.e., in some initial state where carbon is available at or near the surfaces 322) and the underlying layer 312 is exposed through openings 321 in the patterned C-containing layer 320. During the pretreatment step 301 and the reaction step 302, an O-containing gas 332 and an O-reactive precursor 334 are concurrently provided at the patterned C-containing layer 320 to selectively form the mask protection layer 326 (e.g., through a process where C—O bonds are formed resulting in an energetically favorable interaction with the O-reactive precursor 334 to selectively form the mask protection layer 326).

The underlying layer 312 is then etched using a plasma 338 formed be exciting an etchant gas 336 during the etch step 303. As before, the pretreatment step 301, the reaction step 302, and the etch step 303 may be repeated as part of a cycle 309 to continue to etch the underlying layer 312 while protecting the patterned C-containing layer 320 with the mask protection layer 326.

Figure 4:
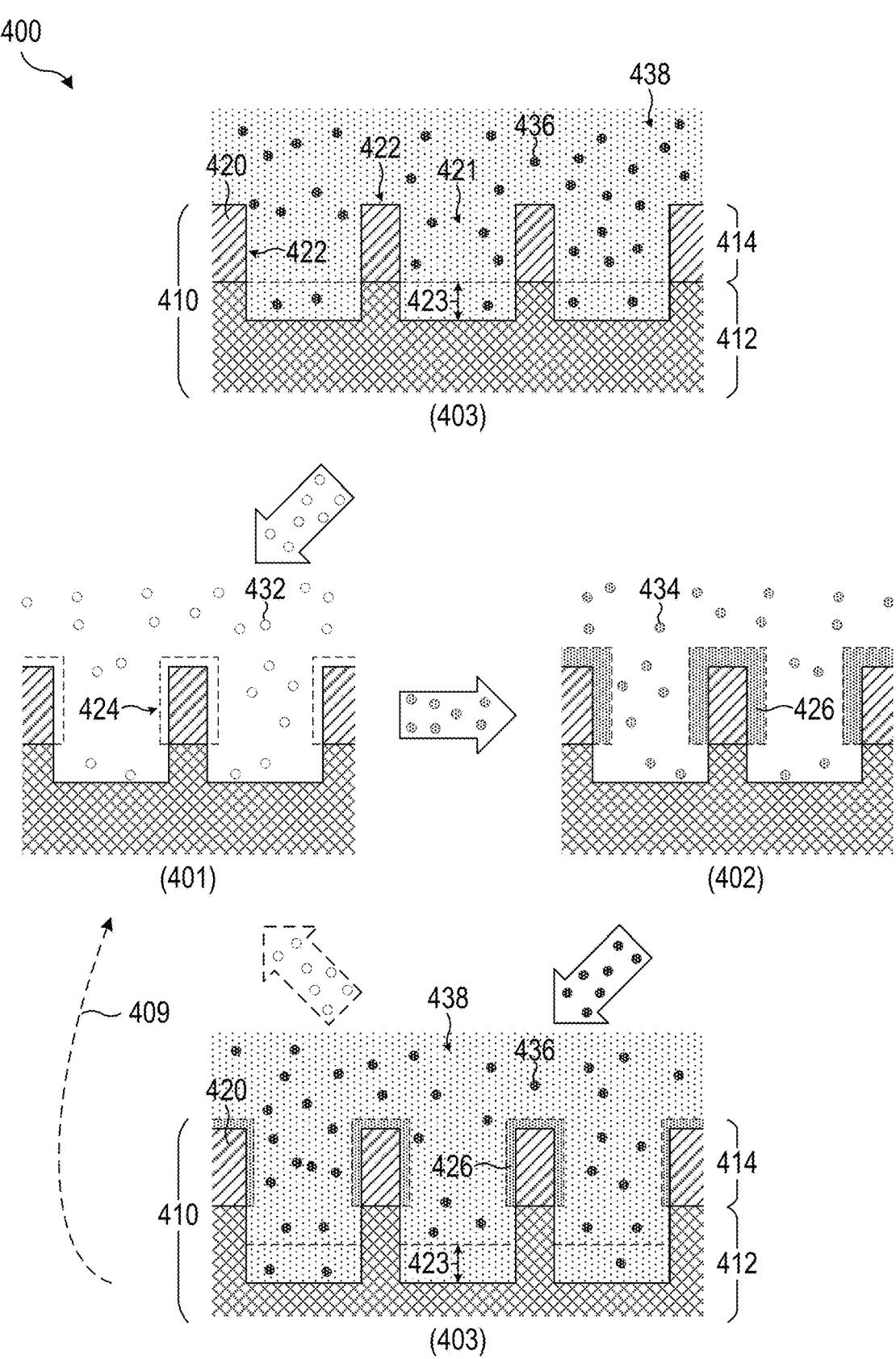
FIG. 4 illustrates an example etching process schematically showing an etch step followed by a pretreatment step and a reaction step performed before another etch step in accordance with embodiments of the invention.

FIG. 4 illustrates an example etching process schematically showing an etch step followed by a pretreatment step and a reaction step performed before another etch step in accordance with embodiments of the invention. The etching process of FIG. 4 may be a specific implementation of other etching processes described herein, such as the etching process of FIG. 2, for example. Similarly labeled elements may be as previously described.

Referring to FIG. 4, an etching process 400 includes both a pretreatment step 401 and a reaction step 402 that selectively form a mask protection layer 426 on surfaces 422 of a patterned C-containing layer 420. An underlying layer 412 is etched with a plasma 438 using the patterned C-containing layer 420 (together with the mask protection layer 426) as an etch mask 414 during an etch step 403. The etching process 400 is a specific example of and is similar to the etching process 200 except that the etching process 400 specifically illustrates that the etch step 403 may also be performed on a substrate 410 in an initial state where the surfaces 422 of the patterned C-containing layer 420 are untreated and the underlying layer 412 is exposed through openings 421 in the patterned C-containing layer 420.

As before, an O-containing gas 432 is provide during the pretreatment step 401 to form C—O bonds 424 and an O-reactive precursor 434 is provided during the reaction step 402 (which may also be performed concurrently). During each of iteration of the etch step 403 (including the etch of the substrate 410 in the initial state), the underlying layer 412 is etched to an etch depth 423 using the plasma formed by exiting an etchant gas 436. The pretreatment step 401, the reaction step 402, and the etch step 403 may be repeated as part of a cycle 409.

Figure 5:
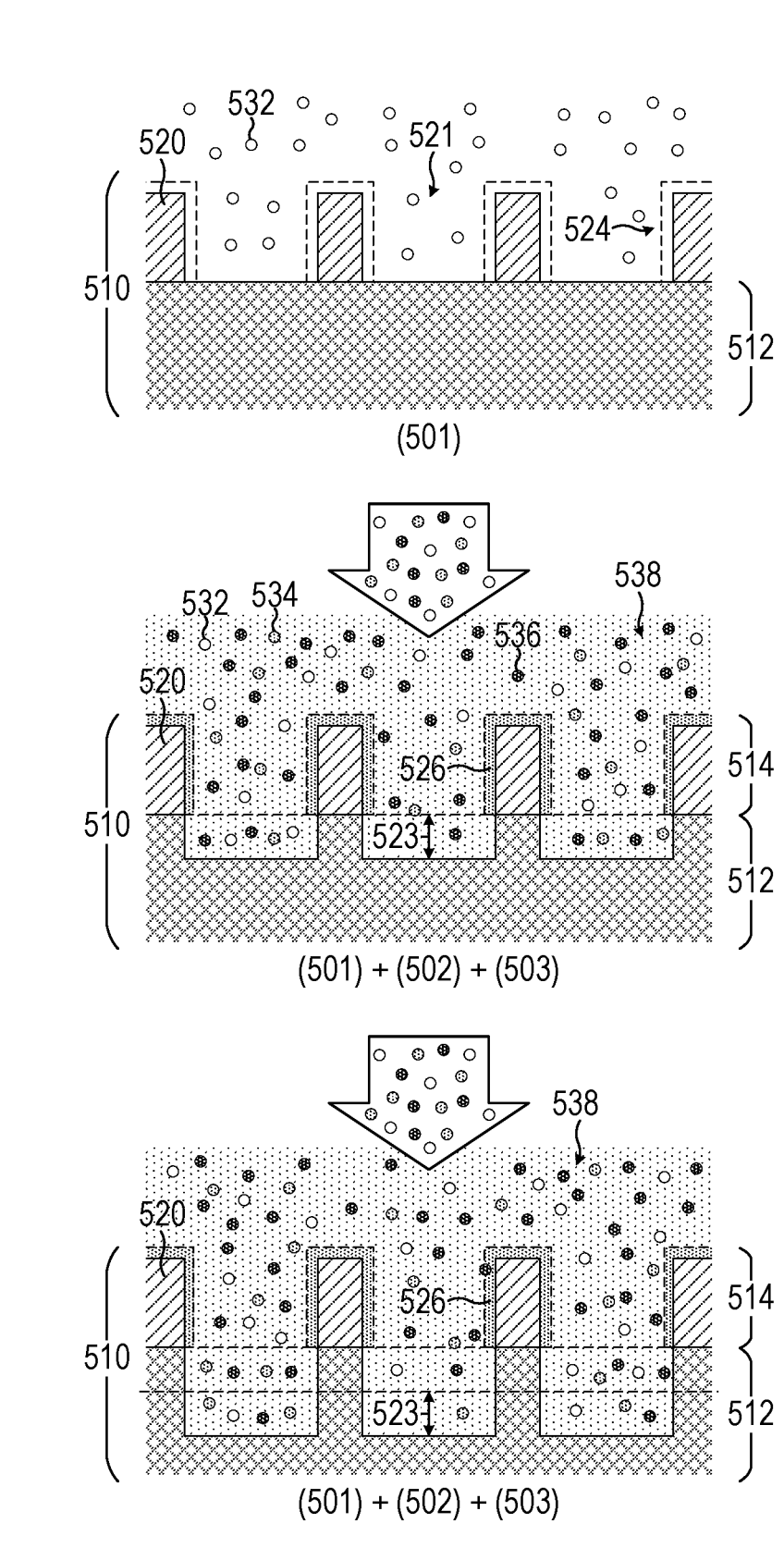
FIG. 5 illustrates an example etching process schematically showing a pretreatment step followed by multiple etch steps that include flowing a gas mixture with an oxygen-containing gas, an oxygen-reactive precursor, and an etchant gas in accordance with embodiments of the invention.

FIG. 5 illustrates an example etching process schematically showing a pretreatment step followed by multiple etch steps that include flowing a gas mixture with an oxygen-containing gas, an oxygen-reactive precursor, and an etchant gas in accordance with embodiments of the invention. The etching process of FIG. 5 may be a specific implementation of other etching processes described herein, such as the etching process of FIG. 2, for example. Similarly labeled elements may be as previously described.

Referring to FIG. 5, an etching process 500 includes both a pretreatment step 501 and a reaction step 502 that selectively form a mask protection layer 526 on surfaces of a patterned C-containing layer 520. An underlying layer 512 is etched with a plasma 538 using the patterned C-containing layer 520 (together with the mask protection layer 526) as an etch mask 514 during an etch step 503. The etching process 500 is a specific example of and is similar to the etching process 200 except that the etching process 500 specifically illustrates that the pretreatment step 501, the reaction step 502, and the etch step 503 may be performed concurrently after an initial performance of the pretreatment step 501 in a substrate 510 in an initial state where the surface of the patterned C-containing layer 520 are untreated and the underlying layer 512 is exposed through openings 521 in the patterned C-containing layer 520.

During the initial performance of the pretreatment step 501 on the substrate 510 in an initial state, an O-containing gas 532 is provide during the pretreatment step 501 to form C—O bonds 524. The underlying layer 512 is then etched during the etch step 503, which is performed concurrently with the reaction step 502, in addition to continuing to provide the O-containing gas 532 (which may also be different for the combined etch step than in the singular pretreatment step 501 in some embodiments). That is, during the etch step 503 a gas mixture is provided at the substrate 510 that includes the O-containing gas 532, the O-reactive precursor 534, and the etchant gas 536. During each of concurrent performances of the pretreatment step 501, the reaction step 502, and the etch step 503, the underlying layer 512 is etched to an etch depth 523 using the plasma formed by exiting the etchant gas 536.

Figure 6:
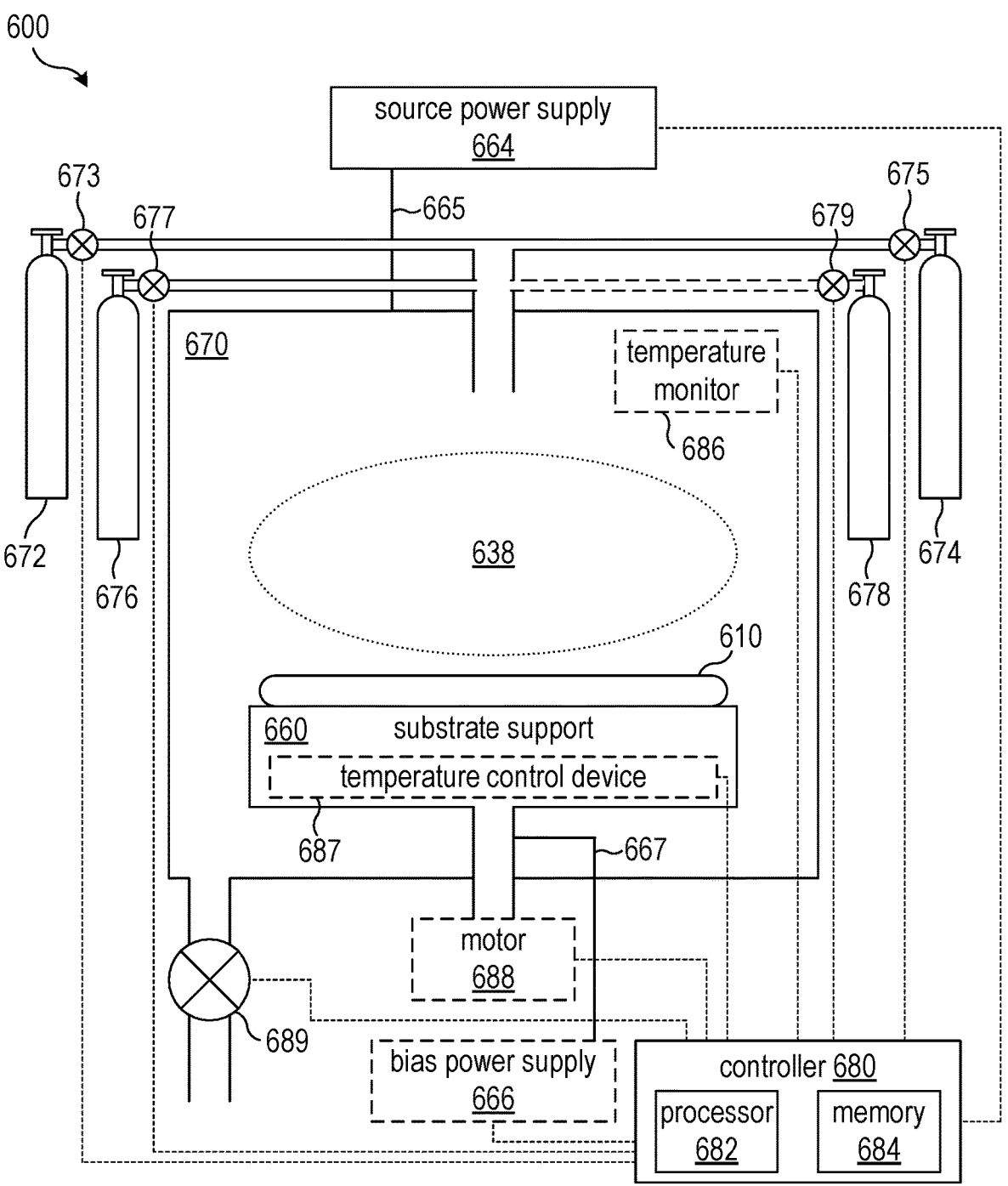
FIG. 6 illustrates an example plasma etching system that has a chamber within which etching processes that include selectively forming a mask protection layer on a patterned carbon-containing layer following a pretreatment step using an oxygen-containing gas to create C—O bonds may be performed in situ in accordance with embodiments of the invention.

FIG. 6 illustrates an example plasma etching system that has a chamber within which etching processes that include selectively forming a mask protection layer on a patterned carbon-containing layer following a pretreatment step using an oxygen-containing gas to create C—O bonds may be performed in situ in accordance with embodiments of the invention. The plasma etching system of FIG. 6 may be used to perform any of the methods and processes described herein such as the method of FIG. 1, for example. Similarly labeled elements may be as previously described.

Referring to FIG. 6, a plasma etching system 600 (e.g., a reactive-ion etching (RIE) etching system) includes a substrate support 660 disposed within a chamber 670, such as a plasma etching chamber, and configured to support a substrate 610. An oxygen source 672 (e.g., a gas source or sources that includes oxygen), a precursor source 674 (e.g., a gas source or sources including one or more precursor gases configured to react with the C—O bonds at surfaces of a patterned C-containing layer to selectively from a mask protection layer), and an etchant source 676 (e.g., a gas source or sources that includes a gas configured to etch a layer underlying the patterned C-containing layer) are fluidically coupled to the chamber 670 through an oxygen valve 673, a precursor valve 675, and an etchant valve 677, respectively.

Additional gas sources and valves may also be included in the plasma etching system 600. For example, an optional source 678 (e.g., a gas source or sources including additional gases, which may be any type of gas, such as carrier gases, additional reactants and precursors, stabilizers, catalysts and others) may be fluidically coupled to the chamber 670 through an optional valve 679. An exhaust valve 689 is also included to evacuate the chamber 670 during the processed performed therein, such as feature growth steps (e.g., including both deposition and etching processes as described in the foregoing), subsequent etching processes, and others.

The plasma etching system 600 is configured to generate plasma 638 during some or all steps of an etching process. Specifically, a source power supply 664 is configured to couple source power 665 to the chamber 670 in order to generate the plasma 638. The chamber 670 may be any suitable etching chamber, such as a capacitively coupled plasma (CCP) etching chamber, an inductively coupled plasma (ICP) etching chamber, etc. A bias power supply 666 may also be included that is configured to supply bias power 667 to the substrate support 660 (and the substrate 610), such as to accelerate ions in the plasma 638 towards the substrate 610, for example. An optional temperature monitor 686 may also be included to monitor and/or aid in controlling the temperature of the substrate 610 and the environment in the chamber 670. An optional temperature control device 687 may be included to raise or lower the temperature of the substrate 610 above or below the equilibrium temperature at the substrate 610 during the etching processes. Alternatively, the optional temperature control device 687 may be a cooler to decrease the temperature of the substrate 610 below equilibrium. An optional motor 688 may also be included to improve uniformity of some processes.

A controller 680 is operatively coupled to source power supply 664 and the valves (the oxygen valve 673, the precursor valve 675, the etchant valve 677, the optional valve 679, etc.), and may be operatively coupled to any of the bias power supply 666 (when included), the optional temperature monitor 686, the optional temperature control device 687, the optional motor 688, and the exhaust valve 689. The controller 680 includes a processor 682 and a memory 684 (i.e., a non-transitory computer-readable medium) that stores a program including instructions that, when executed by the processor 682, perform processes such as the feature grow processes and the subsequent etching processes described herein. For example, the memory 684 may have volatile memory (e.g., random access memory (RAM)) and non-volatile memory (e.g., flash memory). Alternatively, the program may be stored in physical memory at a remote location, such as in cloud storage. The processor 682 may be any suitable processor, such as the processor of a microcontroller, a general-purpose processor (such as a central processing unit (CPU), a microprocessor, a field-programmable gate array (FPGA), an application-specific integrated circuit (ASIC), and others.

Figure 7:
FIG. 7 illustrates a qualitative graph of the energy requirements for adsorption, activation, and reaction for interactions between an oxygen-reactive precursor and various categories of materials that may be included on a substrate a substrate including a patterned carbon-containing layer having openings exposing an underlying layer that is etched in an etching process.
Figure 7:
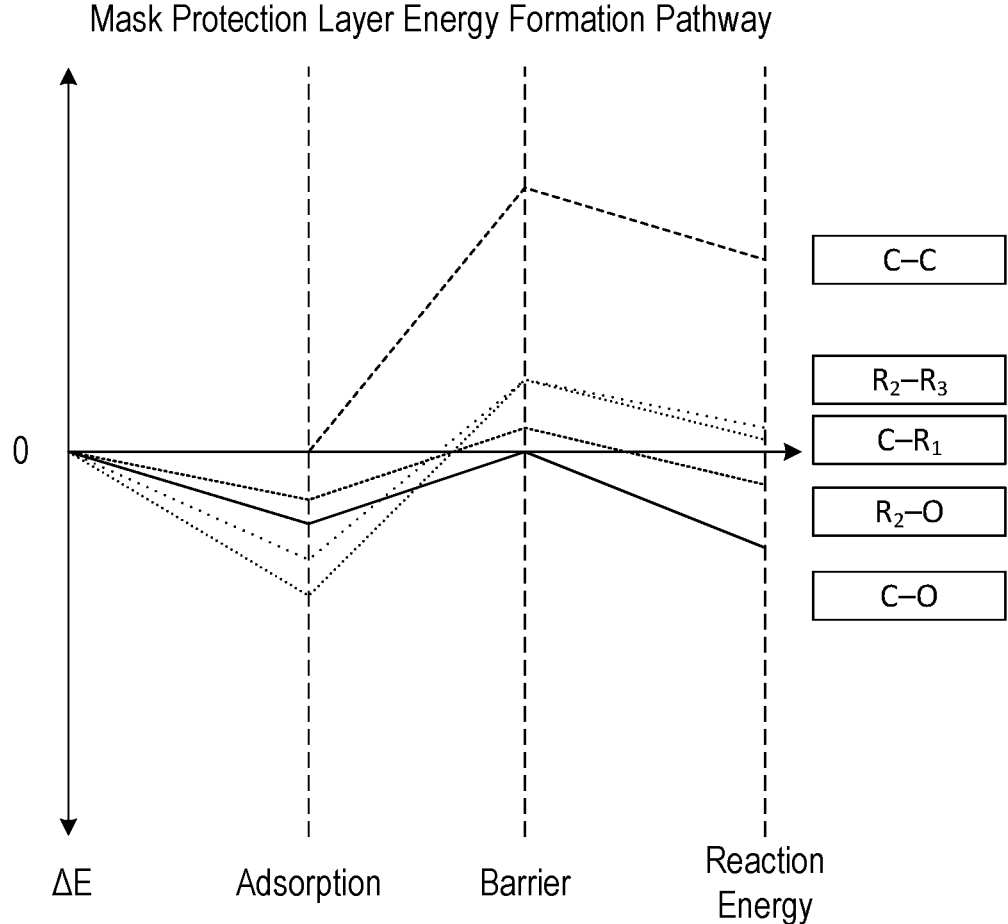

FIG. 7 illustrates a qualitative graph of the energy requirements for adsorption, activation, and reaction for interactions between an O-reactive precursor and various categories of materials that may be included on a substrate a substrate including a patterned carbon-containing layer having openings exposing an underlying layer that is etched in an etching process.

Referring to FIG. 7, a qualitative graph 700 shows an example of differences in energy levels and requirements for various stages of a reaction between an O-reactive precursor and five categories of materials that may be included on a substrate that includes a patterned C-containing layer with openings exposing an underlying layer. The categories of materials are labeled according to bonds that they have at exposed surfaces (e.g., available for possible reactions with the O-reactive precursor during a reaction step). For example, the C—O is not carbon monoxide, but rather some material containing carbon that has C—O bonds available at the surfaces. Moreover, the species bonded at the surface may also have additional species bonded to them, whether from the bulk material or some termination, such as hydrogen, for example.

The C—O material represents sites on surfaces of the patterned C-containing layer (ACL, SoC, diamond-like carbon, photoresist, etc.) that include carbon and oxygen, whether covalently bonded or weakly bonded (e.g., through van der Waals forces) while the C—C material may represent carbon bonded to itself (which may still be part of the patterned C-containing layer). The C—$R_1$ material may represent other materials or sites on the substrate that include carbon bonded with non-oxygen, non-carbon species, such as silicon, nitrogen, and others (defined as various R species).

The graph 700 shows that the O-reactive precursor requires more energy during adsorption, activation (overcoming the energy barrier), and reaction for C—C than for C—O. That is, without additional energy, the O-reactive precursor may adsorb on the C—C, but adsorption is neither favored nor disfavored, while a large amount of additional energy would be needed to activate a reaction. Further, if the energy were provided, the adsorption state is more thermodynamically favorable than the reacted state for C—C suggesting that the activates system would be more likely to revert back to the adsorbed state than the reacted state. For C—$R_1$, the O-reactive precursor adsorbs readily onto the C—$R_1$ surface, but requires additional energy to activate the system. Further, the reacted state is again less favorable than the adsorbed state for C—$R_1$.

The two remaining example materials do not have carbon. Specifically, $R_2$-$R_3$ is a material that does not have carbon or oxygen and while $R_2$—O is a material that has oxygen, but not carbon. These materials may be examples of dielectric materials included in the underlying layer. For example, $R_2$—O may be an oxide, such as silicon oxide, while $R_2$-$R_3$ may be a nitride, such as silicon nitride. Similar to before, while the O-reactive precursor may adsorb to both of these surface types easier than to the C—O surface, additional energy is needed to activate and the adsorbed state is more favorable than the reacted state.

In contrast, adsorption of the O-reactive precursor onto the C—O material is favored, no additional energy is required to overcome the reaction barrier and activate the system, and the reacted state (i.e., where the mask protection layer is formed) is more favorable than the adsorption state. Therefore, for substrates that include patterned C-containing layers with C—C or C—$R_1$ type materials at the surface, an oxygen pretreatment step may be important for forming the mask protection layer from the O-reactive precursor. The fact that more energy may be required to react the O-reactive precursor with all of the example material surfaces except the C—O material, may advantageously allow for the mask protection layer to be selectively formed on the C—O surfaces relative to the other surfaces. Additionally, the energy during the mask protection layer formation process may be kept low to increase selectivity of the mask protection layer process.

Figure 8:
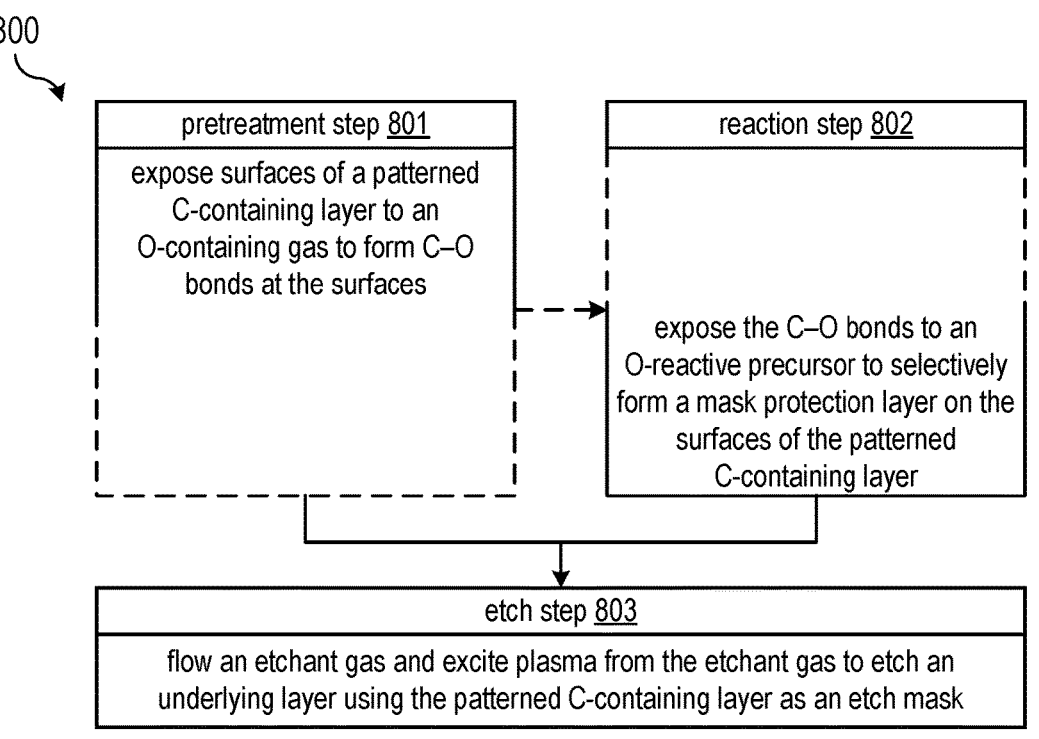
FIG. 8 illustrates a specific example of a method of etching an underlying layer in accordance with embodiments of the invention.

FIG. 8 illustrates a specific example of a method of etching an underlying layer in accordance with embodiments of the invention. The method of FIG. 8 may be combined with other methods and performed using the systems and apparatuses as described herein. For example, the method of FIG. 8 may be combined with any of the embodiments of FIGS. 1-7 and 9. Although shown in a logical order, the arrangement and numbering of the steps of FIG. 8 are not intended to be limited. The method steps of FIG. 8 may be performed in any suitable order or concurrently with one another as may be apparent to a person of skill in the art.

Referring to FIG. 8, a method 800 of etching an underlying layer includes a pretreatment step 801 of exposing surfaces of a patterned C-containing layer to an O-containing gas to form C—O bonds at the surfaces. The patterned C-containing layer has openings exposing the underlying layer. The C—O bonds are exposed to an O-reactive precursor in a reaction step 802 to selectively form a mask protection layer on the surfaces of the patterned C-containing layer. As shown, the reaction step 802 may be performed after the pretreatment step 801 or the two steps may overlap to some degree (whether partially or entirely). However, the reaction step 802 is not performed before the pretreatment step 801.

In an etch step 803 that occurs after at least the pretreatment step 801 (the etch step 803 is performed concurrently with the reaction step 802 after the pretreatment step 801 in some embodiments), an etchant gas is flowed and plasma is excited from the etchant gas to etch to underlying layer using the patterned C-containing layer as an etch mask. The mask protection layer decreases the amount of the patterned C-containing layer that is etched away and thereby protects the etch mask during the etch step 803. If the mask protection layer is fully consumed during the etch step 803 and additional etch depth of the underlying layer is desired, the pretreatment step 801, the reaction step 802, and the etch step 803 may be repeated as a cycle.

Figure 9:
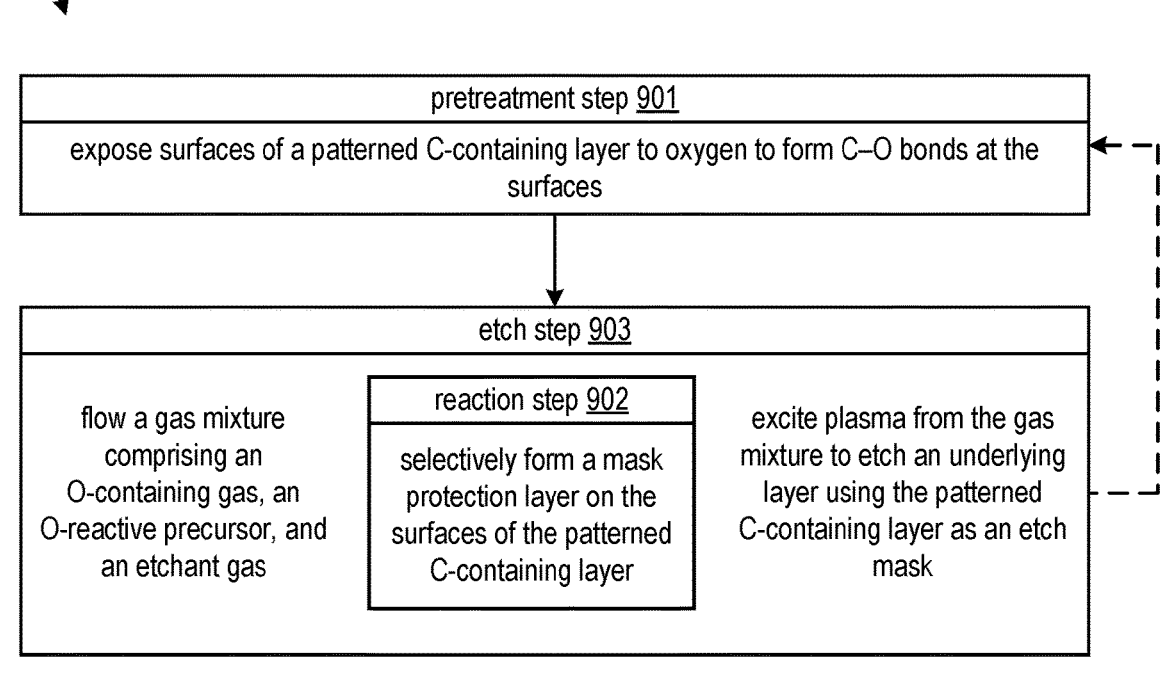
FIG. 9 illustrates another specific example of a method of etching an underlying layer in accordance with embodiments of the invention.

FIG. 9 illustrates another specific example of a method of etching an underlying layer in accordance with embodiments of the invention. The method of FIG. 9 may be combined with other methods and performed using the systems and apparatuses as described herein. For example, the method of FIG. 9 may be combined with any of the embodiments of FIGS. 1-8. Although shown in a logical order, the arrangement and numbering of the steps of FIG. 9 are not intended to be limited. The method steps of FIG. 9 may be performed in any suitable order or concurrently with one another as may be apparent to a person of skill in the art.

Referring to FIG. 9, a method 900 of etching an underlying layer includes a pretreatment step 901 of exposing surfaces of a patterned C-containing layer to oxygen (e.g., using an O-containing gas) to form C—O bonds at the surfaces. The patterned C-containing layer has openings exposing the underlying layer. The pretreatment step 901 is performed before a reaction step 902 of selectively forming a mask protection layer on the surfaces of the patterned C-containing layer. In this specific example, the reaction step 902 is performed concurrently with a etch step 903. During the etch step 903, a gas mixture that includes an O-containing gas, an O-reactive precursor, and an etchant gas is flowed and plasma is excited from the gas mixture to etch the underlying layer using the patterned C-containing layer as an etch mask. A mask protection layer is formed on the surfaces of the patterned C-containing layer using the O-reactive precursor (i.e., while the underlying layer is being etched).

Example embodiments of the invention are summarized here. Other embodiments can also be understood from the entirety of the specification as well as the claims filed herein.

Example 1. A method of etching an underlying layer, the method including: performing a pretreatment step including exposing surfaces of a patterned carbon-containing layer to an oxygen-containing gas to form C—O bonds at the surfaces, the patterned carbon-containing layer having openings exposing the underlying layer; performing a reaction step including exposing the C—O bonds to an oxygen-reactive precursor to selectively form a mask protection layer on the surfaces of the patterned carbon-containing layer; and performing an etch step after the pretreatment step, the etch step including flowing an etchant gas and exciting plasma from the etchant gas to etch the underlying layer using the patterned carbon-containing layer as an etch mask.

Example 2. The method of example 1, where the pretreatment step and the reaction step are performed concurrently.

Example 3. The method of example 1, where the reaction step is performed after the pretreatment step, and where the etch step is performed after the reaction step.

Example 4. The method of example 3, where the reaction step is performed immediately after the pretreatment step without purging the oxygen-containing gas.

Example 5. The method of one of examples 3 and 4, further including: performing a cycle after performing the etch step, the cycle including repeatedly performing the reaction step and the etch step to form additional mask protection layers and continue etching the underlying layer, respectively.

Example 6. The method of example 5, where performing the reaction step during the cycle includes forming the additional mask protection layers without flowing oxygen.

Example 7. The method of one of examples 1 to 6, where the reaction step and the etch step at least partially overlap.

Example 8. The method of one of examples 1 to 7, where no plasma is excited during the pretreatment step.

Example 9. The method of one of examples 1 to 7, where: the etch step further includes applying etch source power to excite the plasma from the etchant gas; and the pretreatment step further includes exciting plasma from the oxygen-containing gas by applying pretreatment source power lower than the etch source power.

Example 10. The method of one of examples 1 to 9, where the oxygen-reactive precursor is a tungsten-containing gas, and where a bulk of the mask protection layer is pure tungsten.

Example 11. The method of one of examples 1 to 10, further including: performing a cycle including repeatedly performing the pretreatment step, the reaction step, and the etch step.

Example 12. A method of etching an underlying layer, the method including: performing a pretreatment step including exposing surfaces of a patterned carbon-containing layer to oxygen to form C—O bonds at the surfaces, the patterned carbon-containing layer having openings exposing the underlying layer; and performing an etch step after the pretreatment step, the etch step including concurrently flowing a gas mixture including an oxygen-containing gas, an oxygen-reactive precursor, and an etchant gas, selectively forming a mask protection layer using the oxygen-reactive precursor on the surfaces of the patterned carbon-containing layer, and exciting plasma from the gas mixture to etch the underlying layer using the patterned carbon-containing layer as an etch mask.

Example 13. The method of example 12, where all carbon-containing compounds in the gas mixture are saturated compounds.

Example 14. The method of one of examples 12 and 13, where no plasma is excited during the pretreatment step.

Example 15. The method of one of examples 12 to 14, further including: performing a cycle including repeatedly performing the pretreatment step and the etch step.

Example 16. A plasma etching system including: a chamber configured to contain plasma; a substrate support disposed in the chamber and configured to support a substrate including a patterned carbon-containing layer having openings exposing an underlying layer; an oxygen source fluidically coupled to the chamber and configured to supply an oxygen-containing gas through one or more valves; a precursor source fluidically coupled to the chamber and configured to supply an oxygen-reactive precursor through the one or more valves; an etchant source fluidically coupled to the chamber and configured to supply an etchant gas through the one or more valves; and a controller operationally coupled to the one or more valves, the controller including a processor and a non-transitory computer-readable medium storing a program including instructions that, when executed by the processor, perform a method including cyclically performing the following steps in situ within the chamber performing a pretreatment step including exposing surfaces of the patterned carbon-containing layer to the oxygen-containing gas to form C—O bonds at the surfaces, performing a reaction step including exposing the C—O bonds to the oxygen-reactive precursor to selectively form a mask protection layer on the surfaces of the patterned carbon-containing layer, and performing an etch step after the pretreatment step, the etch step including flowing the etchant gas and exciting plasma from the etchant gas to etch the underlying layer using the patterned carbon-containing layer as an etch mask.

Example 17. The plasma etching system of example 16, where the reaction step and the etch step at least partially overlap.

Example 18. The plasma etching system of example 17, where the etch step further includes continuing to expose the surfaces of the patterned carbon-containing layer to the oxygen-containing gas.

Example 19. The plasma etching system of one of examples 16 and 17, where the pretreatment step and the reaction step are performed concurrently.

Example 20. The plasma etching system of one of examples 16 and 17, where the reaction step is performed after the pretreatment step, and where the etch step is performed after the reaction step.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of etching an underlying layer, the method comprising:

performing a pretreatment step comprising exposing surfaces of a patterned carbon-containing layer to an oxygen-containing gas to form C—O bonds at the surfaces, the patterned carbon-containing layer having openings exposing the underlying layer;

performing a reaction step comprising exposing the C—O bonds to an oxygen-reactive precursor to selectively form a mask protection layer on the surfaces of the patterned carbon-containing layer; and performing an etch step after the pretreatment step, the etch step comprising flowing an etchant gas and exciting plasma from the etchant gas to etch the underlying layer using the patterned carbon-containing layer as an etch mask.

2. The method of claim 1, wherein the pretreatment step and the reaction step are performed concurrently.

3. The method of claim 1, wherein the reaction step is performed after the pretreatment step, and wherein the etch step is performed after the reaction step.

4. The method of claim 3, wherein the reaction step is performed immediately after the pretreatment step without purging the oxygen-containing gas.

5. The method of claim 3, further comprising:
performing a cycle after performing the etch step, the cycle comprising repeatedly performing the reaction step and the etch step to form additional mask protection layers and continue etching the underlying layer, respectively.

6. The method of claim 5, wherein performing the reaction step during the cycle comprises forming the additional mask protection layers without flowing oxygen.

7. The method of claim 1, wherein the reaction step and the etch step at least partially overlap.

8. The method of claim 1, wherein no plasma is excited during the pretreatment step.

9. The method of claim 1, wherein:
the etch step further comprises applying etch source power to excite the plasma from the etchant gas; and
the pretreatment step further comprises exciting plasma from the oxygen-containing gas by applying pretreatment source power lower than the etch source power.

10. The method of claim 1, wherein the oxygen-reactive precursor is a tungsten-containing gas, and wherein a bulk of the mask protection layer is pure tungsten.

11. The method of claim 1, further comprising:
performing a cycle comprising repeatedly performing the pretreatment step, the reaction step, and the etch step.

12. A method of etching an underlying layer, the method comprising:
performing a pretreatment step comprising exposing surfaces of a patterned carbon-containing layer to oxygen to form C—O bonds at the surfaces, the patterned carbon-containing layer having openings exposing the underlying layer; and
performing an etch step after the pretreatment step, the etch step comprising concurrently
flowing a gas mixture comprising an oxygen-containing gas, an oxygen-reactive precursor, and an etchant gas,
selectively forming a mask protection layer using the oxygen-reactive precursor on the surfaces of the patterned carbon-containing layer, and
exciting plasma from the gas mixture to etch the underlying layer using the patterned carbon-containing layer as an etch mask.

13. The method of claim 12, wherein all carbon-containing compounds in the gas mixture are saturated compounds.

14. The method of claim 12, wherein no plasma is excited during the pretreatment step.

15. The method of claim 12, further comprising:
performing a cycle comprising repeatedly performing the pretreatment step and the etch step.

16. A plasma etching system comprising:
a chamber configured to contain plasma;
a substrate support disposed in the chamber and configured to support a substrate comprising a patterned carbon-containing layer having openings exposing an underlying layer;
an oxygen source fluidically coupled to the chamber and configured to supply an oxygen-containing gas through one or more valves;
a precursor source fluidically coupled to the chamber and configured to supply an oxygen-reactive precursor through the one or more valves;
an etchant source fluidically coupled to the chamber and configured to supply an etchant gas through the one or more valves; and
a controller operationally coupled to the one or more valves, the controller comprising a processor and a non-transitory computer-readable medium storing a program including instructions that, when executed by the processor, perform a method comprising cyclically performing the following steps in situ within the chamber
performing a pretreatment step comprising exposing surfaces of the patterned carbon-containing layer to the oxygen-containing gas to form C—O bonds at the surfaces,
performing a reaction step comprising exposing the C—O bonds to the oxygen-reactive precursor to selectively form a mask protection layer on the surfaces of the patterned carbon-containing layer, and
performing an etch step after the pretreatment step, the etch step comprising flowing the etchant gas and exciting plasma from the etchant gas to etch the underlying layer using the patterned carbon-containing layer as an etch mask.

17. The plasma etching system of claim 16, wherein the reaction step and the etch step at least partially overlap.

18. The plasma etching system of claim 17, wherein the etch step further comprises continuing to expose the surfaces of the patterned carbon-containing layer to the oxygen-containing gas.

19. The plasma etching system of claim 16, wherein the pretreatment step and the reaction step are performed concurrently.

20. The plasma etching system of claim 16, wherein the reaction step is performed after the pretreatment step, and wherein the etch step is performed after the reaction step.

* * * * *